US012745651B2

(12) United States Patent
Chou et al.

(10) Patent No.: US 12,745,651 B2
(45) Date of Patent: Sep. 22, 2026

(54) SEMICONDUCTOR PACKAGE CARRIER BOARD STRUCTURE AND MANUFACTURING METHOD THEREOF

(71) Applicant: PHOENIX PIONEER TECHNOLOGY CO., LTD., Hsinchu County (TW)

(72) Inventors: Pao-Hung Chou, Hsinchu County (TW); Ming-Yeh Chang, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 405 days.

(21) Appl. No.: 18/450,167

(22) Filed: Aug. 15, 2023

(65) Prior Publication Data

US 2024/0055274 A1 Feb. 15, 2024

(30) Foreign Application Priority Data

Aug. 15, 2022 (TW) ................................. 111130675

(51) Int. Cl.

| | |
|---|---|
| ***H10W 70/685*** | (2026.01) |
| ***H10P 72/70*** | (2026.01) |
| ***H10W 70/05*** | (2026.01) |
| ***H10W 74/01*** | (2026.01) |

(52) U.S. Cl.
CPC ............. *H10W 70/05* (2026.01); *H10P 72/74* (2026.01); *H10W 70/685* (2026.01); *H10W 74/014* (2026.01); *H10W 74/019* (2026.01); *H10P 72/7424* (2026.01)

(58) Field of Classification Search
CPC ............................. H10W 70/685; H10P 72/74
See application file for complete search history.

(56) References Cited

U.S. PATENT DOCUMENTS

| | | | | |
|---|---|---|---|---|
| 2006/0216859 A1* | 9/2006 | Yang | H10F 39/804 438/108 |
| 2021/0020594 A1* | 1/2021 | Chiu | H10W 70/60 |
| 2021/0153355 A1* | 5/2021 | Matsumoto | H05K 1/186 |
| 2022/0115301 A1* | 4/2022 | Bowers | H10W 70/20 |

* cited by examiner

*Primary Examiner* — Michael Jung
(74) *Attorney, Agent, or Firm* — Studebaker Brackett PLLC

(57) ABSTRACT

A semiconductor package carrier board structure includes a plurality of carrier board bodies and a plurality of supporting bumps. The carrier board body includes a build-up circuit structure and a plurality of conductive blocks bonded to the build-up circuit structure. Adjacent ones of the carrier board bodies are connected to each other with their corresponding conductive blocks. An area formed by the adjacent conductive blocks defines a cutting path. An opening is formed on a surface of each of the conductive blocks at the cutting path. The supporting bumps are erected between the adjacent openings. As such, each of the supporting bumps corresponds to a position overlapping the cutting path to provide the support function of the semiconductor package carrier board structure when performing the semiconductor packaging operation. After performing the singulation operation, the supporting bumps can be completely removed and one side of the openings can be exposed.

8 Claims, 14 Drawing Sheets

SEMICONDUCTOR PACKAGE CARRIER BOARD STRUCTURE AND MANUFACTURING METHOD THEREOF

BACKGROUND

1. Technical Field

The present disclosure relates to a semiconductor packaging process, and more particularly, to a semiconductor package carrier board structure that can improve reliability and a manufacturing method thereof.

2. Description of Related Art

With the development of industrial applications, in recent years, the functions required for semiconductor chips for applying in network-communication servers, high-speed computing, artificial intelligence (AI), etc. have become more and more diversified, and their performance has become higher and higher, so reliability requirements are also increased.

At present, when an electronic package 1 (as shown in FIG. 1A, for example, an electronic package for vehicles) is required to be packaged with high reliability, the soldering state can be inspected by the appearance whether the surrounding pins have filleting to the copper pads of the side walls (such as a solder pad 111 and a solder material 18 shown in FIG. 1B) in order to ensure that the soldering state is good. For example, a semi-groove structure 13 can be formed at a pin of a carrier board 11 for carrying a semiconductor chip, wherein the carrier board 11 can be a packaged circuit carrier board as shown in FIG. 1C (full copper can be plated on the solder pad 111 first, and then the sidewall of the solder pad 111 can be etched to form the semi-groove structure 13).

FIG. 1D is a schematic cross-sectional view of the conventional electronic package 1 before the singulation process. As shown in FIG. 1D, a strip-shaped substrate 10 is provided in the electronic package 1 and includes a plurality of the carrier boards 11 that are connected to each other, and then grooves 12 are formed on a cutting path S of the strip-shaped substrate 10, so that the strip-shaped substrate 10 is bonded onto a package molding carrier 8 with the side of the grooves 12, wherein the bottom of the groove 12 of the strip-shaped substrate 10 has an insulating block 14, the insulating block 14 is flush with the bottom of the groove 12, and the material of the insulating block 14 is the same as the material of a dielectric layer 110 of the carrier board 11. Afterward, a packaging process is performed on a die-placing side of the carrier board 11, so as to dispose a semiconductor element 16 on the carrier board 11, and then the semiconductor element 16 is covered with a molding layer 17. Finally, a singulation process is performed along the cutting path S to obtain the electronic package 1, and the solder pad 111 on the solder pad side of the carrier board 11 forms the semi-groove structure 13.

In the subsequent assembly operation, the electronic package 1 is placed on a circuit board 1*b* with the solder pads 111 (a surface treatment layer can be formed on the surface, such as a nickel-gold layer) thereof via the solder material 18 (as shown in FIG. 1B).

In the manufacturing method of the conventional electronic package 1, the strip-shaped substrate 10 is extremely thin, and the space of the groove 12 of the strip-shaped substrate 10 is too large. Therefore, when forming the molding layer 17, because of the injection pressure in the mold, and because the hollow space between the carrier board 11 and the package molding carrier 8 needs to be extracted into a vacuum state so that the strip-shaped substrate 10 is subjected to great pressure, the strip-shaped substrate 10 will collapse and deform along the grooves 12 and even easily engender micro-cracks, resulting in that the adhesive material of the molding layer 17 will seep into the grooves 12 of the carrier board 11 from the die-placing side of the carrier board 11 to contaminate the solder pads 111.

Moreover, since the adhesive material infiltrated from the molding layer 17 will overflow onto the semi-groove structure 13 of the carrier board 11, the filleting path and function of the solder material 18 will be blocked. Furthermore, the infiltrated adhesive material will cover the semi-groove structure 13, so that the semi-groove structure 13 loses the main function of observing the filleting state of solder.

Therefore, how to overcome various problems of the above-mentioned prior art has become a difficult problem urgently to be overcome in the industry.

SUMMARY

In view of the various deficiencies of the prior art, the present disclosure provides a semiconductor package carrier board structure, comprising: a plurality of carrier board bodies each including a build-up circuit structure and a plurality of conductive blocks, wherein each of the plurality of carrier board bodies is defined with a first surface and a second surface opposing the first surface, and the plurality of conductive blocks are disposed on peripheral surfaces of at least two opposite sides of the build-up circuit structure and are electrically connected to the build-up circuit structure, wherein the first surface and/or the second surface has a plurality of electrical connection pads for connecting external elements, and a cutting path is defined by an area formed by the plurality of conductive blocks, so that an opening is respectively formed on the first surface of each of the plurality of carrier board bodies corresponding to each of the plurality of conductive blocks; and a plurality of supporting bumps each erected between two adjacent ones of the openings and overlapping with the cutting path, wherein one end of each of the supporting bumps is combined with a bottom of each of the openings and protrudes from the bottom of each of the openings, and a surface of the other end of each of the supporting bumps is recessed or flush with the first surface of each of the carrier board bodies.

In the aforementioned semiconductor package carrier board structure, two adjacent ones of the carrier board bodies are connected by the conductive blocks to form a one-piece structure, and each of the supporting bumps is a metal bump.

In the aforementioned semiconductor package carrier board structure, two adjacent ones of the carrier board bodies are connected by the plurality of conductive blocks via the supporting bump, and the supporting bump is an insulating block. For example, a contour of a surrounding body of the supporting bump is formed in a concave-convex shape. Further, the supporting bump has a lateral portion that is in a shape of a cross, and a part of the lateral portion is embedded in the conductive blocks. Alternatively, the supporting bump has at least two lateral portions, wherein one of the lateral portions is partially or completely embedded in the conductive blocks, and the other lateral portion is used as an end of the supporting bump. Even, a bottommost surface of the bottom of each of the openings is lower than the other lateral portion used as the end of the supporting bump.

In the aforementioned semiconductor package carrier board structure, a width of each of the supporting bumps is not greater than a width of the cutting path.

In the aforementioned semiconductor package carrier board structure, a junction of the bottom and a side wall of each of the openings is a concave arc surface.

The present disclosure also provides a method of manufacturing a semiconductor package carrier board structure, the method comprising: providing a carrier board with a metal surface; forming a plurality of carrier board bodies each including a build-up circuit structure and a plurality of conductive blocks on the carrier board by a circuit build-up process, wherein each of the plurality of carrier board bodies is defined with a first surface and a second surface opposing the first surface, and the plurality of carrier board bodies are bonded to the metal surface of the carrier board with the second surfaces, and the plurality of conductive blocks are respectively formed on peripheral surfaces of at least two opposite sides of the build-up circuit structure, so that the plurality of conductive blocks are electrically connected to the build-up circuit structure, and adjacent ones of the carrier board bodies are integrally connected by the respective corresponding conductive blocks, and a cutting path is defined by an area adjacent to the plurality of conductive blocks; forming an anti-etching barrier layer on the first surface of each of the plurality of carrier board bodies by a patterning process, and exposing part of surfaces of the plurality of conductive blocks, wherein a width of the anti-etching barrier layer covering the cutting path is not greater than a width of the cutting path; removing part of exposed material of the plurality of conductive blocks by an etching process to form a blind hole-shaped opening on each of the plurality of conductive blocks, wherein a portion of the plurality of conductive blocks corresponding to the cutting path that is not etched is used as a supporting bump; removing the anti-etching barrier layer to expose the first surface of each of the carrier board bodies; and removing the carrier board to expose the second surface of each of the carrier board bodies.

In the aforementioned method, the method further comprises forming a surface treatment layer on a surface of the opening and an exposed surface of the supporting bump before removing the carrier board.

The present disclosure further provides a method of manufacturing a semiconductor package carrier board structure, the method comprising: providing a carrier board with a metal surface; forming a plurality of carrier board bodies each including a build-up circuit structure and a plurality of conductive blocks on the carrier board by a circuit build-up process, wherein each of the plurality of carrier board bodies is defined with a first surface and a second surface opposing the first surface, and the plurality of carrier board bodies are bonded to the metal surface of the carrier board with the second surfaces, and the plurality of conductive blocks are respectively formed on peripheral surfaces of at least two opposite sides of the build-up circuit structure, so that the plurality of conductive blocks are electrically connected to the build-up circuit structure, wherein there is a gap between the respective conductive blocks of adjacent ones of the plurality of carrier board bodies and is separated, and the gap is filled with an insulating material, and a cutting path is defined by an area formed by the plurality of conductive blocks and the insulating material between adjacent ones of the plurality of carrier board bodies, wherein a width of the insulating material at the cutting path is not greater than a width of the cutting path; forming an anti-etching barrier layer on the first surface of each of the plurality of carrier board bodies by a patterning process, wherein the cutting path is exposed from the anti-etching barrier layer; removing part of exposed material of the plurality of conductive blocks by an etching process to form a blind hole-shaped opening on each of the plurality of conductive blocks, wherein the insulating material that is remained and not etched at the cutting path is used as a supporting bump; removing the anti-etching barrier layer to expose the first surface of each of the plurality of carrier board bodies; and removing the carrier board to expose the second surface of each of the plurality of carrier board bodies.

In the aforementioned method, the method further comprises forming a surface treatment layer on a surface of the opening before removing the carrier board.

In the aforementioned method, a contour of a surrounding body of the supporting bump is formed in a concave-convex shape. For example, the supporting bump is formed with a lateral portion, so that a contour of the supporting bump is in a shape of a cross, and the lateral portion is partially embedded in the conductive blocks. Further, the supporting bump is formed with at least two lateral portions arranged at intervals, and one of the lateral portions is partially or completely embedded in the conductive blocks, and the other lateral portion is formed as an end of the supporting bump.

In the aforementioned method, the plurality of conductive blocks on sides of the first surfaces between adjacent ones of the plurality of carrier board bodies are connected and combined into one-piece; wherein a portion of a surface of each of the plurality of conductive blocks is exposed from the anti-etching barrier layer, and a width of the exposed portion is greater than the width of the cutting path; and wherein an etching process is performed to remove part of the exposed portion of the plurality of conductive blocks to form a blind hole-shaped opening on each of the plurality of conductive blocks, and adjacent ones of the openings are connected to expose the insulating material used as a supporting bump. For example, a contour of a surrounding body of the supporting bump is formed in a concave-convex shape. Further, the supporting bump is formed with at least two lateral portions arranged at intervals, wherein one of the lateral portions is completely embedded in the conductive blocks, and the other lateral portion is formed as an end of the supporting bump. Alternatively, a bottommost surface of a bottom of each of the openings is lower than the other lateral portion used as the end of the supporting bump.

In the aforementioned method, the method further comprises after removing the carrier board, disposing a plurality of semiconductor elements on the second surfaces of the plurality of carrier board bodies to electrically connect to the build-up circuit structures, and forming a molding layer on the second surfaces of the plurality of carrier board bodies to cover the plurality of semiconductor elements. The method further comprises after forming the molding layer, performing a cutting process along the cutting path to remove the supporting bump to obtain a plurality of one-piece semiconductor packages.

It can be seen from the above that the semiconductor package carrier board structure and the manufacturing method thereof of the present disclosure is to divide the conventional groove into two openings by the design of the supporting bump. It not only reduces the space of the conventional groove, but also provides structural strengthening and supporting functions when the carrier board body is assembled onto the package molding carrier for molding operation. Therefore, compared with the prior art, when the molding operation is performed, the carrier board body can withstand the high pressure of the mold sealing glue, and will not be deformed and broken by high pressure, so as to effectively avoid the problem that the adhesive material of the molding layer overflows to the first surface of the carrier board body and contaminates the circuit layer.

Moreover, since the adhesive material of the molding layer will not overflow to the first surface of the carrier board body, the adhesive material of the molding layer will not cover the opening. Therefore, the semi-opening structure formed by the opening of the semiconductor package carrier board structure will not lose the main function of observing the filleting state of solder.

BRIEF DESCRIPTION OF THE DRAWINGS

FIG. 3B-2, FIG. 3C-2, FIG. 3D-2, FIG. 3E-2 and FIG. 3F-2 are schematic cross-sectional views illustrating a manufacturing method of a semiconductor package carrier board structure according to a third embodiment of the present disclosure.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "first," " "second," "a," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2F are schematic cross-sectional views illustrating a manufacturing method of a semiconductor package carrier board structure 2 according to a first embodiment of the present disclosure.

Figure 1A:
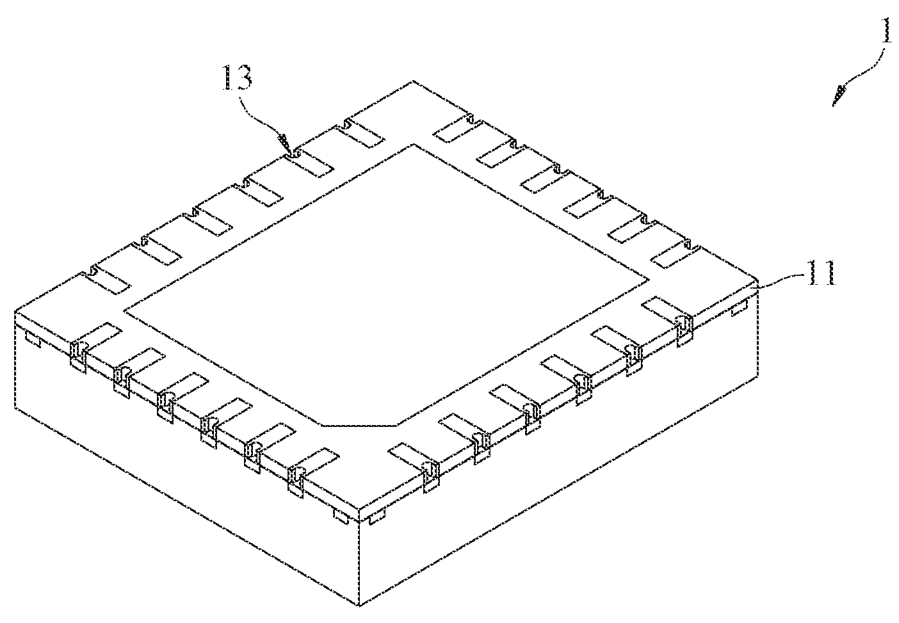
FIG. 1A is a schematic perspective view of a conventional electronic package.
Figure 1B:
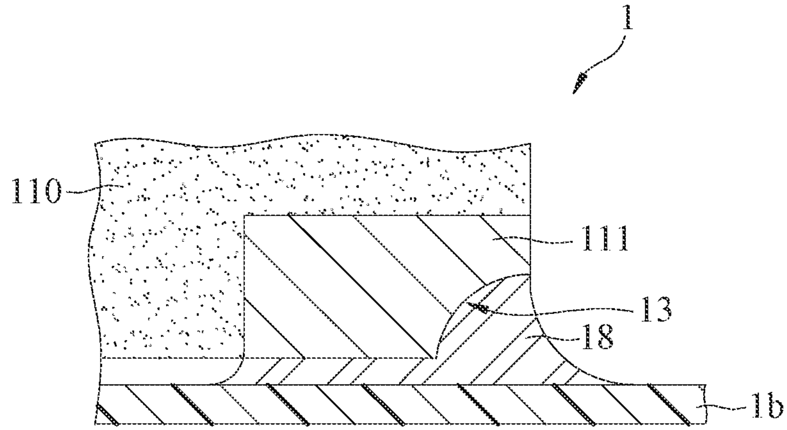
FIG. 1B is a schematic partially enlarged cross-sectional view of the conventional electronic package.
Figure 1C:
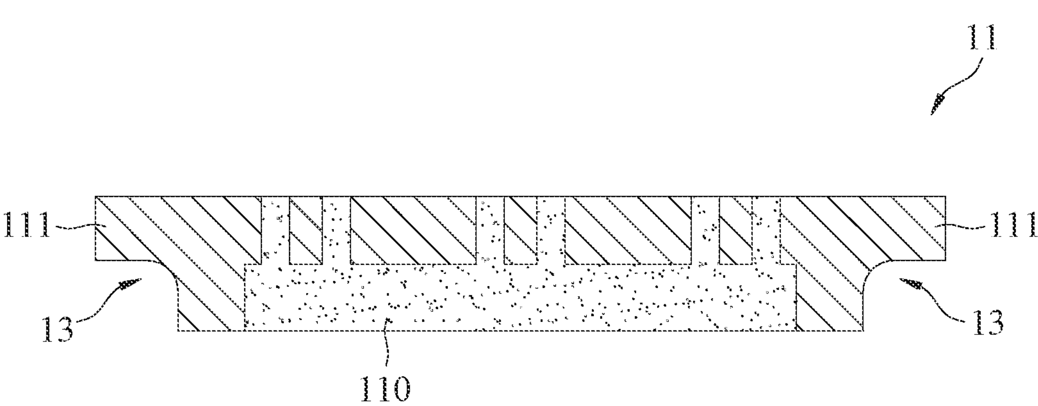
FIG. 1C is a schematic cross-sectional view of the conventional electronic package.
Figure 1D:
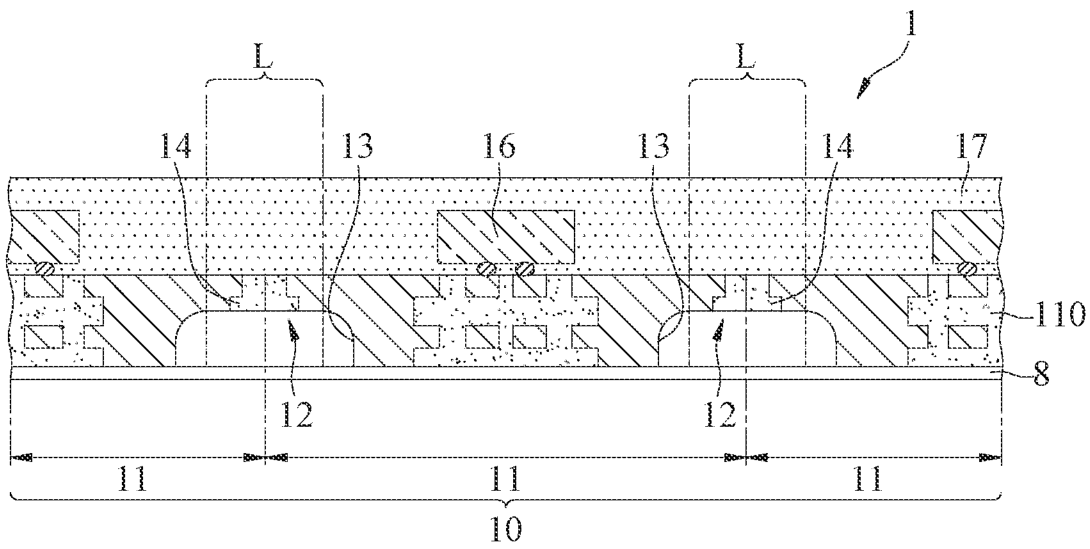
FIG. 1D is a schematic cross-sectional view of the conventional electronic package before the singulation process.
Figure 2A:
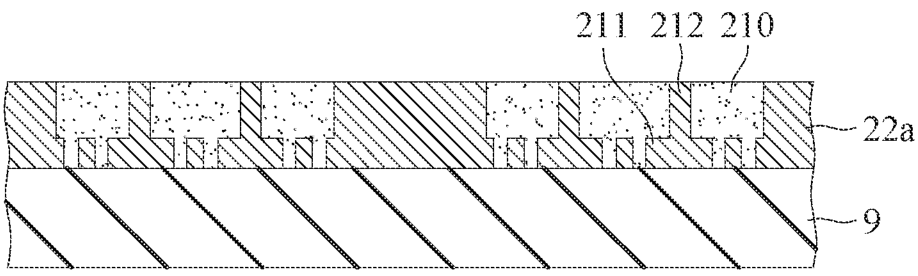
FIG. 2A to FIG. 2F are schematic cross-sectional views illustrating a manufacturing method of a semiconductor package carrier board structure according to a first embodiment of the present disclosure.
Figure 2B:
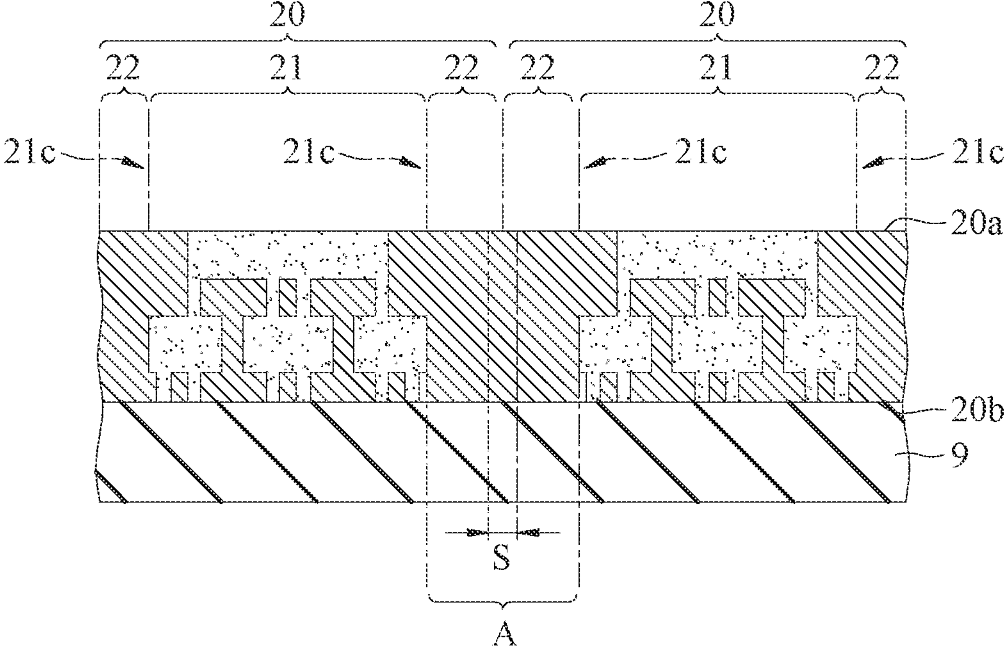

As shown in FIG. 2A to FIG. 2B, a carrier board 9 with a metal surface is provided, such as a copper foil substrate or a metal board, and then a circuit build-up process is performed to form a plurality of carrier board bodies 20, wherein each of the plurality of carrier board bodies 20 includes a build-up circuit structure 21 and a plurality of conductive blocks 22 on the metal surface of the carrier board 9, wherein each of the plurality of carrier board bodies 20 is defined with a first surface 20*a* and a second surface 20*b* opposite to each other in the vertical direction, and the plurality of carrier board bodies 20 are bonded to the metal surface of the carrier board 9 with the second surfaces 20*b*, and the conductive blocks 22 arranged at intervals are respectively formed on peripheral surfaces 21*c* on at least two opposite sides of the build-up circuit structure 21 of each of the carrier board bodies 20 in the horizontal direction, so that the plurality of conductive blocks 22 are electrically connected to the build-up circuit structure 21, and two adjacent ones of the carrier board bodies 20 are connected by the respective conductive blocks 22 to form an integrated structure, and an area A formed by two adjacent ones of the conductive blocks 22 defines the cutting path S.

In an embodiment, the carrier board body 20 is formed with the coreless build-up circuit structure 21 (a core layer structure is also applicable) by a build-up method such as semi-additive process (SAP), wherein each layer of wiring may include a dielectric layer 210, a circuit layer 211 embedded in one side of the dielectric layer 210, and a plurality of conductive pillars 212 (or laser conductive blind vias) embedded in the dielectric layer 210 and arranged on the circuit layer 211, as shown in FIG. 2A, and the circuit layer 211 is electrically connected to the conductive pillars 212. For example, the build-up circuit structure 21 includes two layers of wiring, as shown in FIG. 2B, and the outermost wiring can be selectively formed or not formed with the conductive pillars 212.

Moreover, existing processes such as lithographic patterning and electroplating are utilized for forming the circuit layer 211 and the conductive pillars 212, and the dielectric material of the dielectric layer 210 is such as Ajinomoto build-up film (ABF), photosensitive dielectric material, polyimide (PI), bismaleimide triazine (BT), flame resistant/retardant 5 (FR5) prepreg (PP), molding resin (molding compound), film epoxy molding resin (epoxy molding compound [EMC]), or others.

In addition, a leveling process such as grinding, chemical etching, laser ablation, sandblasting, or plasma etching can be performed, as shown in FIG. 2A, to remove part of the material of the conductive pillars 212 and part of the material of the dielectric layer 210, so that the surface of the dielectric layer 210 is flush with the end surfaces of the conductive pillars 212, such that the end surfaces of the conductive pillars 212 are exposed from the top surface of the dielectric layer 210.

In addition, the plurality of conductive blocks 22 are fabricated at the same time when forming the circuit layer 211 and the conductive pillars 212, so the plurality of conductive blocks 22 are formed by stacking blocks 22*a* stacked on top of each other.

Figure 2C:
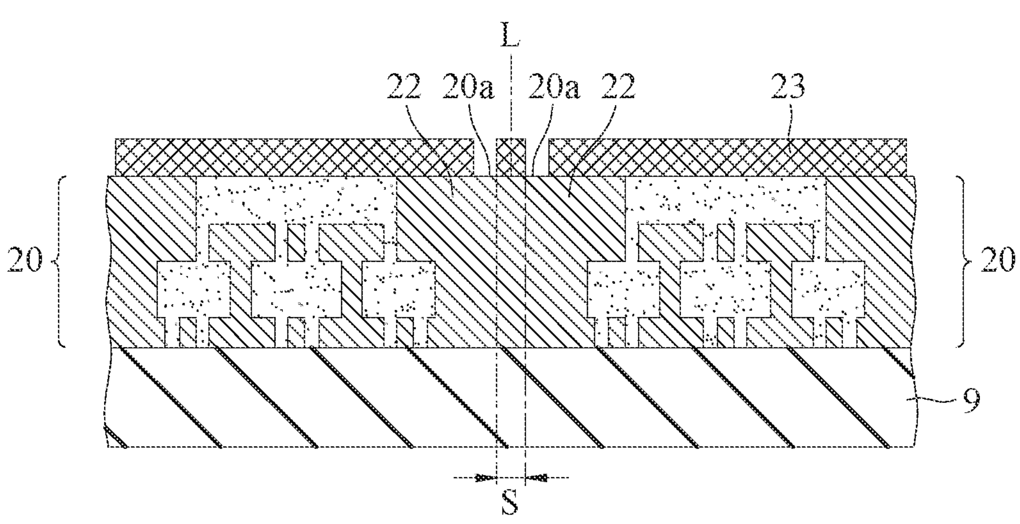

As shown in FIG. 2C, a patterning process is performed to form an anti-etching barrier layer 23 on the first surfaces

20*a* of the plurality of carrier board bodies 20, and parts of the surfaces of the plurality of carrier board bodies 20 corresponding to the plurality of conductive blocks 22 are exposed, wherein the width of the anti-etching barrier layer 23 covering the cutting path S is not greater than the width of the cutting path S.

In an embodiment, the junction of each of the carrier board bodies 20 is a midline position L of the cutting path S, and the anti-etching barrier layer 23 covers the midline position L and extends to the left and right sides of the midline position L to cover part of the surface of each of the plurality of conductive blocks 22.

Figure 2D:
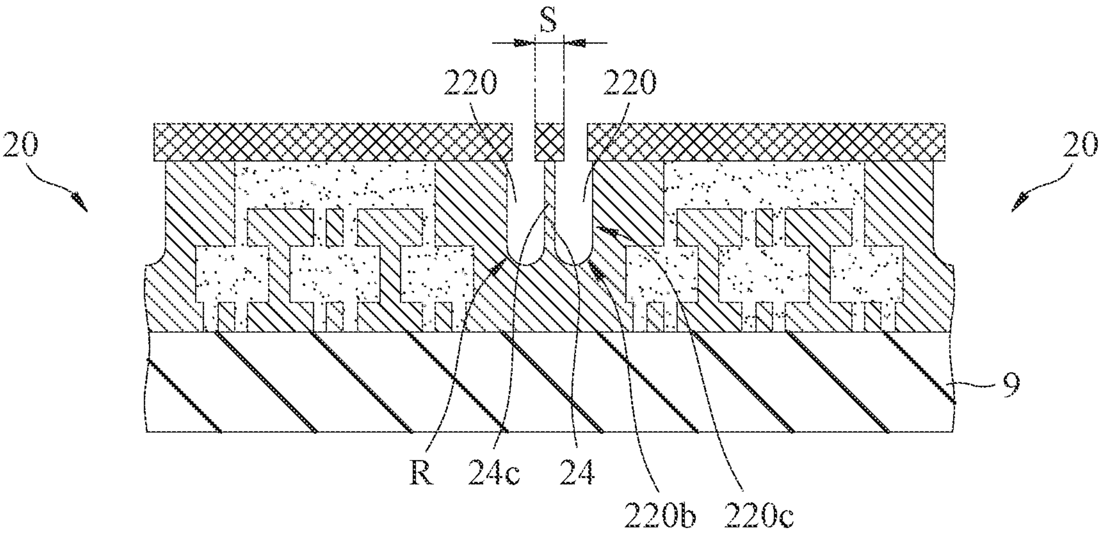

As shown in FIG. 2D, an etching process is performed to remove part of the material of the plurality of conductive blocks 22 not covered by the anti-etching barrier layer 23 (i.e., the exposed part of the surface of the conductive block 22), so as to form a blind hole-shaped opening 220 on the surface of each of the plurality of carrier board bodies 20 corresponding to each of the plurality of conductive blocks 22, and the portion of the plurality of conductive blocks 22 corresponding to the cutting path S that is not etched is used as a supporting bump 24.

In an embodiment, the contour of a surrounding body 24*c* of the supporting bump 24 is straight, and the junction of a bottom 220*b* and a side wall 220*c* of the opening 220 is a concave arc surface R, and one end of the supporting bump 24 is combined with the bottom 220*b* of the opening 220.

Figure 2E:
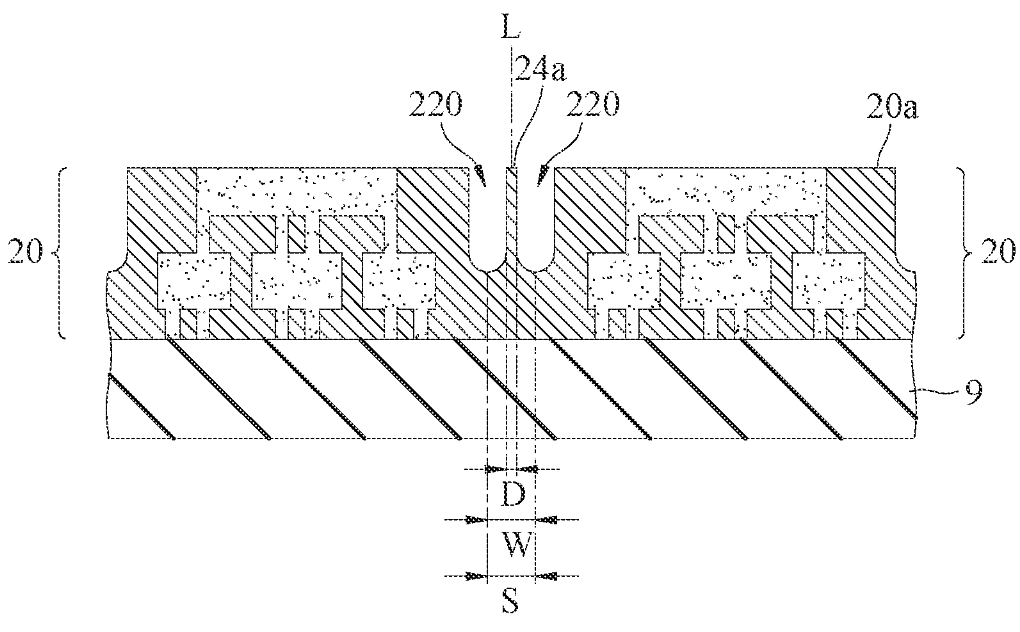

As shown in FIG. 2E, the anti-etching barrier layer 23 is removed, so that the first surfaces 20*a* of the carrier board bodies 20, the openings 220 and the supporting bump 24 are exposed, so that a surface 24*a* of the other end of the supporting bump 24 is flush with the first surfaces 20*a* of the carrier board bodies 20.

In an embodiment, the supporting bump 24 is symmetrical based on the midline position L, and a width D of the supporting bump 24 is not greater than a width W of the cutting path S.

Figure 2F:
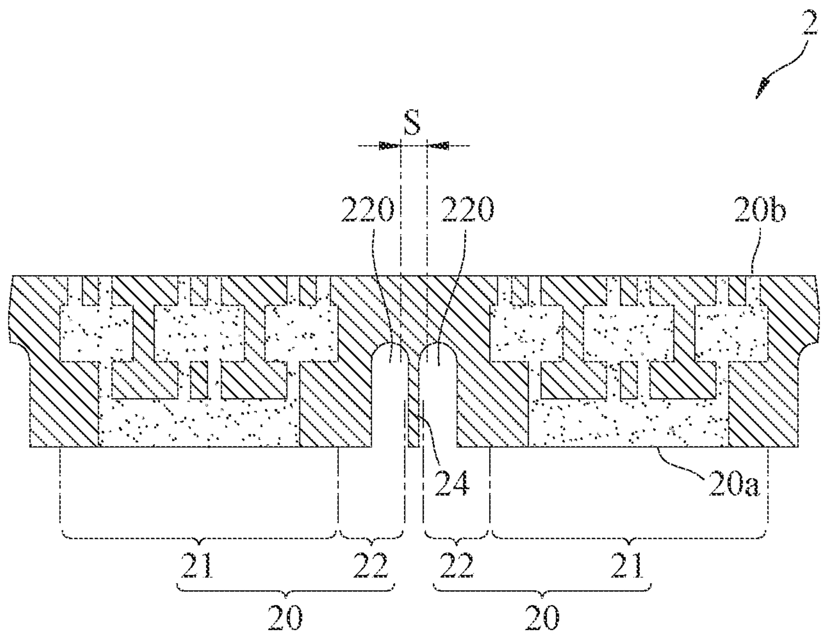

As shown in FIG. 2F, a surface treatment process is performed to form a surface treatment layer (not shown) on the surfaces of the openings 220, the exposed surface 24*a* and the surrounding body 24*c* of the supporting bump 24. Then, the carrier board 9 is removed to expose the second surfaces 20*b* of the carrier board bodies 20.

Figure 5A:
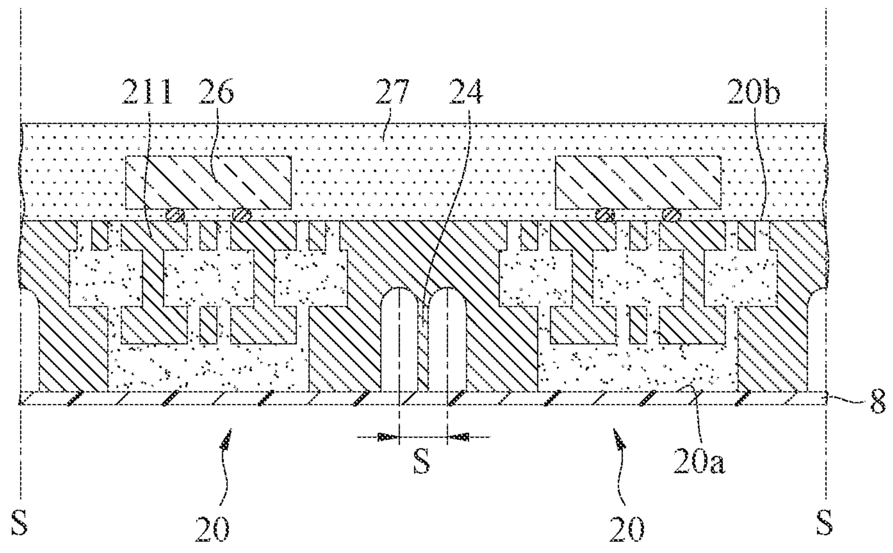
FIG. 5A to FIG. 5C are schematic cross-sectional views showing the subsequent manufacturing processes of FIG. 2F.

In an embodiment, the first surface 20*a* of each of the plurality of carrier board bodies 20 is used as a solder pad side for connecting a conductor 28 (such as a solder ball shown in FIG. 5C), and the second surface 20*b* of each of the plurality of carrier board bodies 20 is used as a die-placing side for placing a semiconductor element 26 (such as the chip shown in FIG. 5A), so that a plurality of the semiconductor elements 26 are electrically connected to the build-up circuit structures 21, such that, during the molding operation in the subsequent packaging process (as shown in FIG. 5A), a molding layer 27 is formed on the second surfaces 20*b* of the plurality of carrier board bodies 20 to cover the plurality of semiconductor elements 26.

Figure 5B:
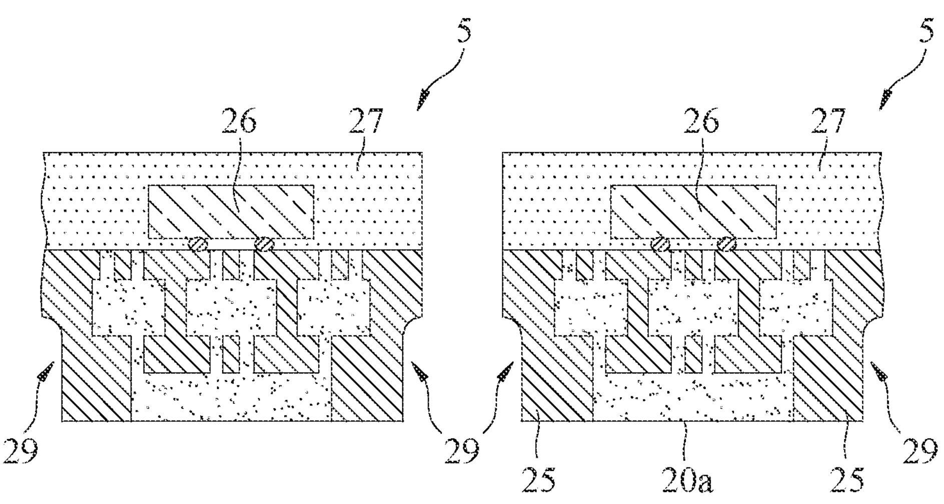
Figure 5C:
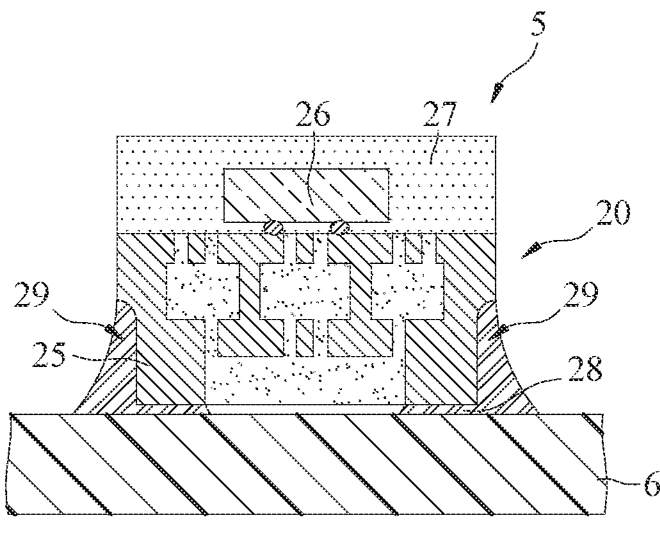

Moreover, after forming the molding layer 27, as shown in FIG. 5B, a cutting process can be performed along the cutting path S to remove the supporting bumps 24, so as to obtain a plurality of one-piece semiconductor packages 5, so that the opening 220 forms a semi-opening structure 29. When the semiconductor package 5 is assembled on a circuit board 6, as shown in FIG. 5C, it can be observed whether the conductor 28 is reliably bonded to an electrical connection pad 25 of the circuit layer 211 through the filleting condition on the semi-opening structure 29.

Therefore, the manufacturing method of the present disclosure is to divide the conventional groove into two openings 220 by the design of the supporting bump 24. It not only reduces the space of the conventional groove, but also provides structural strengthening and supporting functions when the carrier board body 20 is assembled onto the package molding carrier 8 for molding operation. Therefore, compared with the prior art, when the molding operation is performed, the carrier board body 20 can withstand the high pressure of the mold sealing glue, and will not be deformed and broken by high pressure, so as to effectively avoid the problem that the adhesive material of the molding layer 27 overflows to the first surface 20*a* (solder pad side) and contaminates the electrical connection pad 25 of the circuit layer 211.

Moreover, since the adhesive material of the molding layer 27 will not overflow to the first surface 20*a* (solder pad side) of the carrier board body 20, the filleting function of the semi-opening structure 29 will not be affected by the adhesive material of the molding layer 27. Furthermore, the adhesive material of the molding layer 27 will not cover the semi-opening structure 29, so the semi-opening structure 29 will not lose the main function of observing the filleting state of solder.

FIG. 3A, FIG. 3B-1, FIG. 3C-1, FIG. 3D-1, FIG. 3E-1 and FIG. 3F-1 are schematic cross-sectional views illustrating a manufacturing method of a semiconductor package carrier board structure 3 according to a second embodiment of the present disclosure. The difference between the second embodiment and the first embodiment lies in the fabrication of a supporting bump 34, and the other manufacturing processes are substantially the same, so the similarities between the second embodiment and the first embodiment will not be repeated below.

Figure 3A:
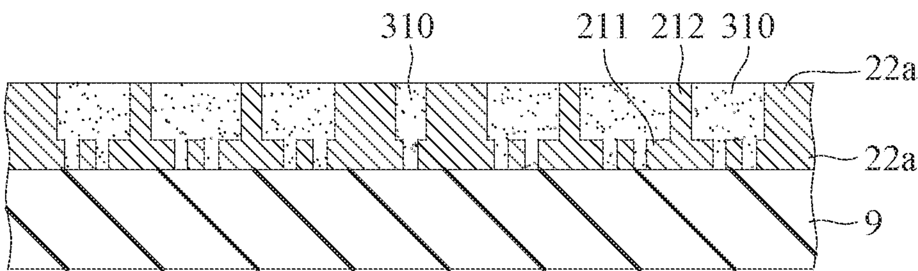
FIG. 3A, FIG. 3B-1, FIG. 3C-1, FIG. 3D-1, FIG. 3E-1 and FIG. 3F-1 are schematic cross-sectional views illustrating a manufacturing method of a semiconductor package carrier board structure according to a second embodiment of the present disclosure.
Figures 1, 3B:
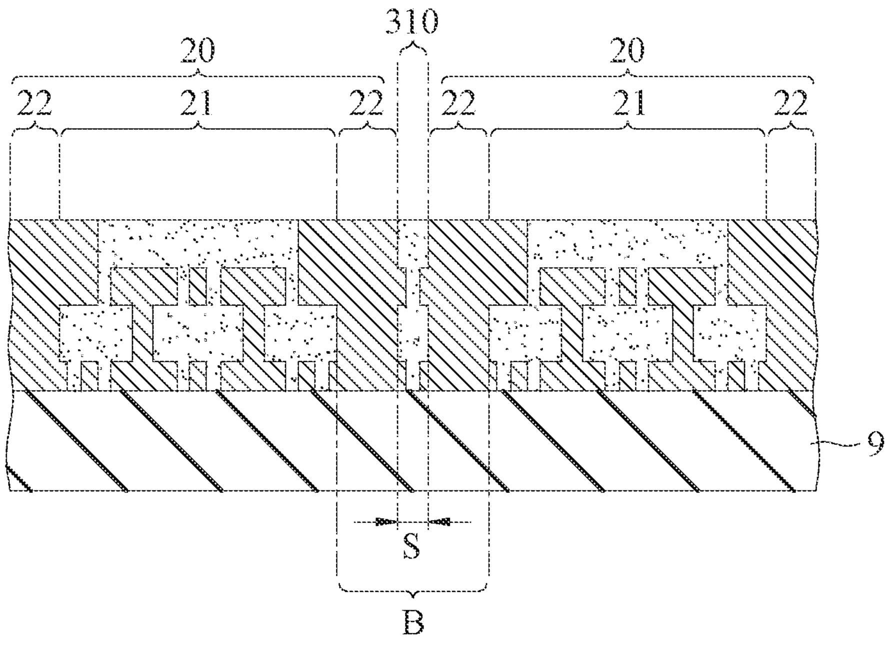

As shown in FIG. 3A to FIG. 3B-1, the carrier board 9 with a metal surface is provided first, such as a copper foil substrate or a metal board, and then a circuit build-up process is performed to form a plurality of the carrier board bodies 20, wherein each of the plurality of carrier board bodies 20 includes a build-up circuit structure 21 and a plurality of conductive blocks 22 on the metal surface of the carrier board 9, wherein there is a gap between the respective conductive blocks 22 of two adjacent ones of the carrier board bodies 20 and is separated, and the gap is filled with an insulating material 310, and an area B formed by the plurality of conductive blocks 22 and the insulating material 310 between two adjacent ones of the carrier board bodies 20 defines the cutting path S, wherein the width of the insulating material 310 at the cutting path S is not greater than the width of the cutting path S.

In an embodiment, the insulating material 310 is such as Ajinomoto build-up film (ABF), photosensitive dielectric material, polyimide (PI), bismaleimide triazine (BT), flame resistant/retardant 5 (FR5) prepreg (PP), molding resin (molding compound), film epoxy molding resin (epoxy molding compound [EMC]), or others. For example, when the dielectric layer 210 is formed, the insulating material 310 is formed together so that the insulating material 310 and the dielectric layer 210 are integrally formed. It should be understood that the insulating material 310 and the dielectric layer 210 can also be formed separately, and the insulating material 310 and the dielectric layer 210 can be made of different materials according to requirements.

Figures 2, 3B:
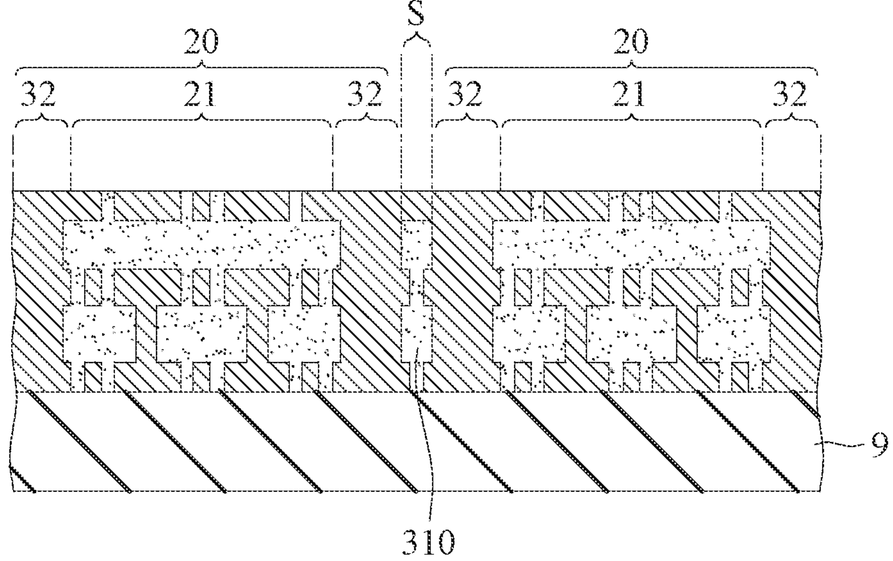

Moreover, in another embodiment, as shown in FIG. 3B-2, a plurality of conductive blocks 32 adjacent to the first surfaces 20*a* of the plurality of carrier board bodies 20 between two adjacent ones of the carrier board bodies 20 are connected and combined as one and cover the surface of the insulating material 310.

Figures 1, 3C:
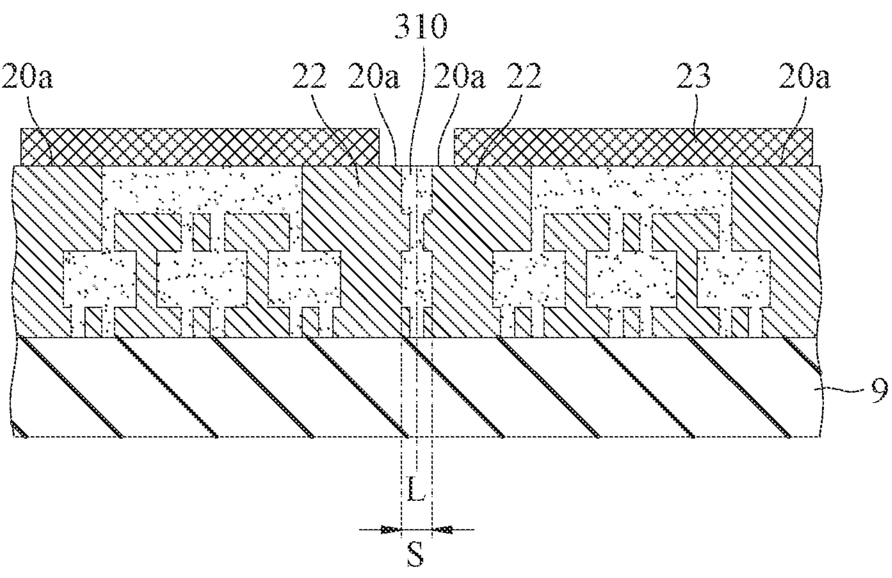
Figures 2, 3C:
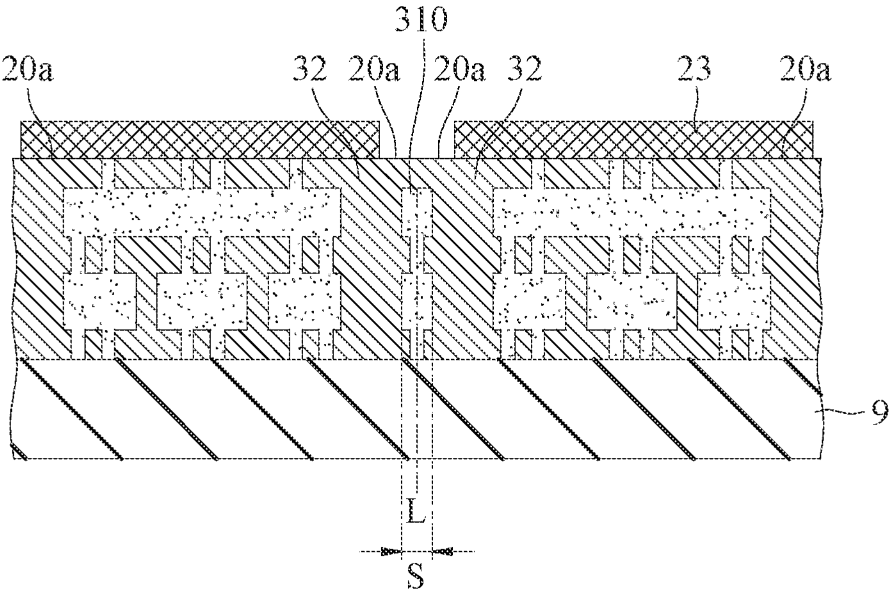

As shown in FIG. 3C-1, following the process shown in FIG. 3B-1, a patterning process is performed to form the anti-etching barrier layer 23 on the first surface 20*a* of each of the plurality of carrier board bodies 20, and the insulating material 310 and parts of the surfaces of the plurality of carrier board bodies 20 corresponding to the plurality of conductive blocks 22 are exposed.

In an embodiment, the junction of each of the carrier board bodies 20 is the cutting path S, so that the midline position L of the cutting path S is exposed from the anti-etching barrier layer 23, and the anti-etching barrier layer 23 extends to the left and right sides of the midline position L, such that the insulating material 310 and the conductive blocks 22 are exposed from the anti-etching barrier layer 23.

Moreover, in another embodiment, following the process shown in FIG. 3B-2, portions of the surfaces of the plurality of carrier board bodies 20 corresponding to the plurality of conductive blocks 32 are exposed from the anti-etching barrier layer 23, as shown in FIG. 3C-2, and the width of the exposed portions is greater than the width of the cutting path S.

Figures 1, 3D:
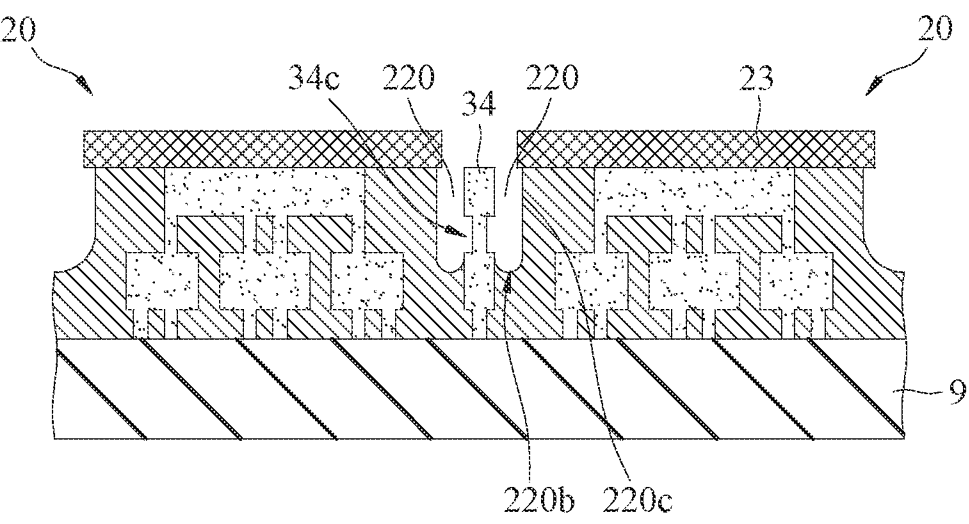
Figures 2, 3D:
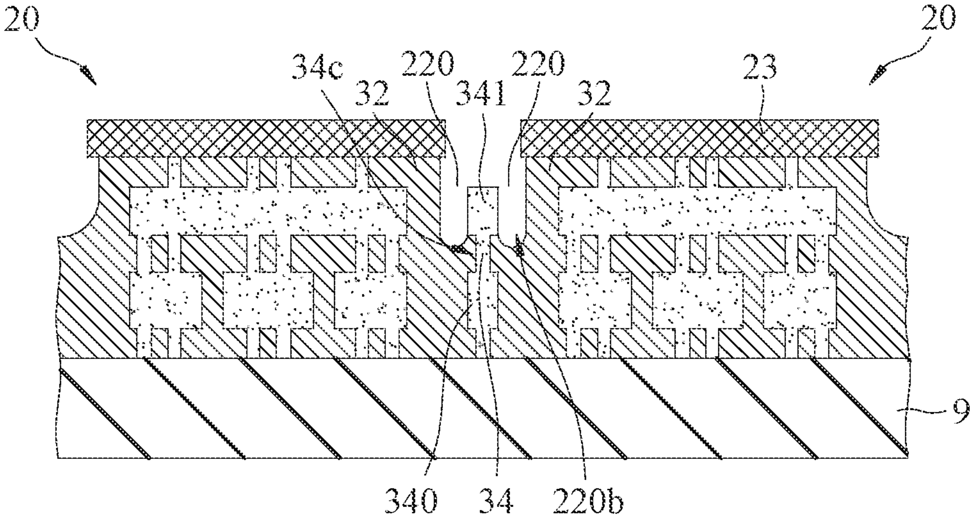

As shown in FIG. 3D-1, an etching process is performed to remove part of the material of the plurality of conductive blocks 22 not covered by the anti-etching barrier layer 23 (i.e., the exposed part of the surface of the conductive block 22), so as to respectively form a blind hole-shaped opening 220 on the surface of each of the plurality of carrier board bodies 20 corresponding to each of the plurality of conductive blocks 22, and the insulating material 310 remaining unetched at the cutting path S is used as the supporting bump 34.

In an embodiment, the contour of a surrounding body 34*c* of the supporting bump 34 is formed in a concave-convex shape, and the junction of the bottom 220*b* and the side wall 220*c* of the opening 220 is the concave arc surface R, so that one end of the supporting bump 34 is bonded to the bottom 220*b* of the opening 220.

Figure 4A:
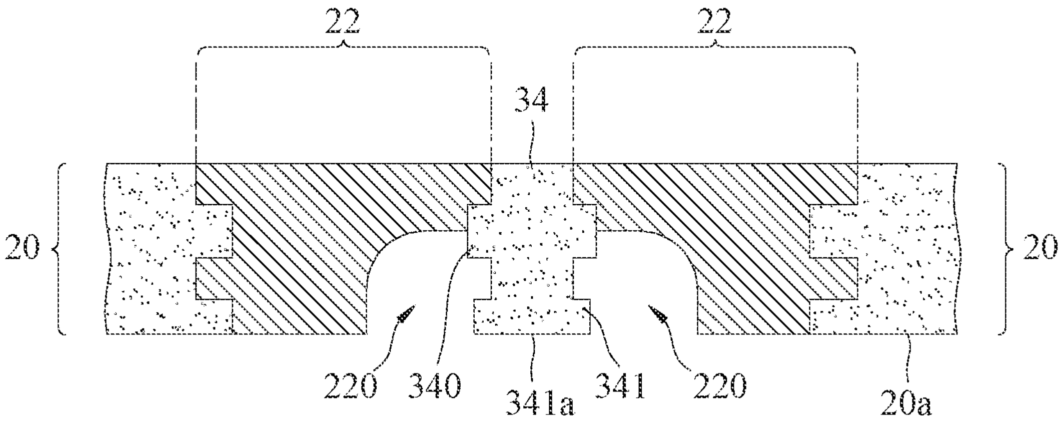
FIG. 4A and FIG. 4B are schematic partially enlarged cross-sectional views showing different aspects of the semiconductor package carrier board structure according to the present disclosure.
Figure 4B:
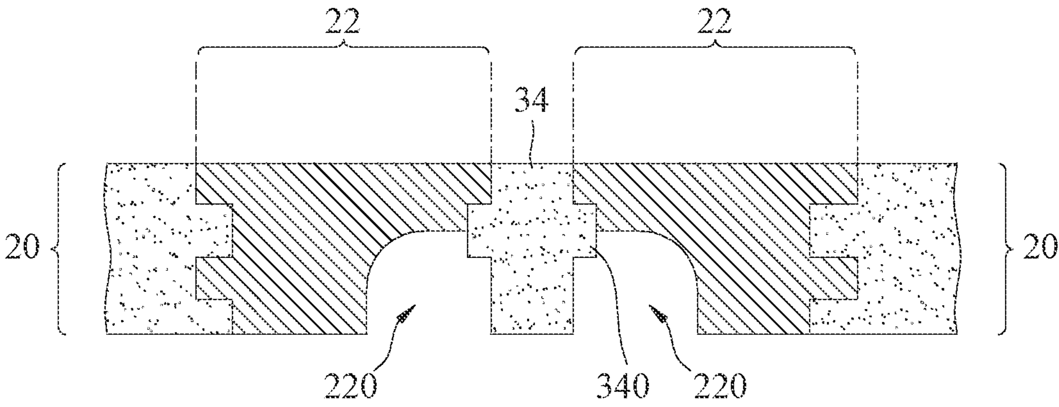

Moreover, the supporting bump 34 has a plurality of lateral portions 340, 341 spaced apart from each other, such as two lateral portions 340, 341 in a "±" shape, as shown in FIG. 4A, wherein one lateral portion 340 is partially embedded in the conductive blocks 22, and the other lateral portion 341 is formed as an end of the supporting bump 34, and a surface 341*a* of the lateral portion 341 is flush with the first surface 20*a* of each of the carrier board bodies 20. Alternatively, as shown in FIG. 4B, the supporting bump 34 is formed with a single lateral portion 340, so that the contour of the surrounding body 34*c* of the supporting bump 34 is in the shape of a cross or "+," and since the insulating material 310 and the carrier board bodies 20 are fabricated by a circuit build-up process, the lateral portion 340 is partially embedded in the conductive blocks 22.

Also, in another embodiment, if the process shown in FIG. 3C-2 is continued, an etching process is performed to remove part of the material of the exposed part of each of the plurality of conductive blocks 32 (that is, the parts not covered by the anti-etching barrier layer 23), so as to respectively form a blind hole-shaped opening 220 on the surface of each of the plurality of carrier board bodies 20 corresponding to each of the plurality of conductive blocks 32, and the openings 220 on the adjacent ones of the plurality of conductive blocks 32 are connected to expose the insulating material 310 to be used as a supporting bump 34, as shown in FIG. 3D-2, wherein one lateral portion 340 of the supporting bump 34 is completely embedded in the conductive blocks 32, and the other lateral portion 341 is formed as an end of the supporting bump 34 to lean against the bottom of the opening 220 and protrude from the bottom of the opening 220, and particularly, the bottommost surface of the bottom of the opening 220 is lower than the lateral portion 341 as an end of the supporting bump 34. Therefore, compared with the adjacent surface of the lateral portion 341 and the bottom of the opening 220 (or the adjacent surface of the conductive block 32 and the bottom of the opening 220), the bottom of the opening 220 is further recessed into the conductive block 32 (as shown in FIG. 3D-2), and can provide an additional anti-seepage glue function during the molding operation of the subsequent packaging process.

Therefore, there is no special limitation regarding the design of the supporting bump and the configuration of the lateral portion according to requirements.

Figures 1, 3E:
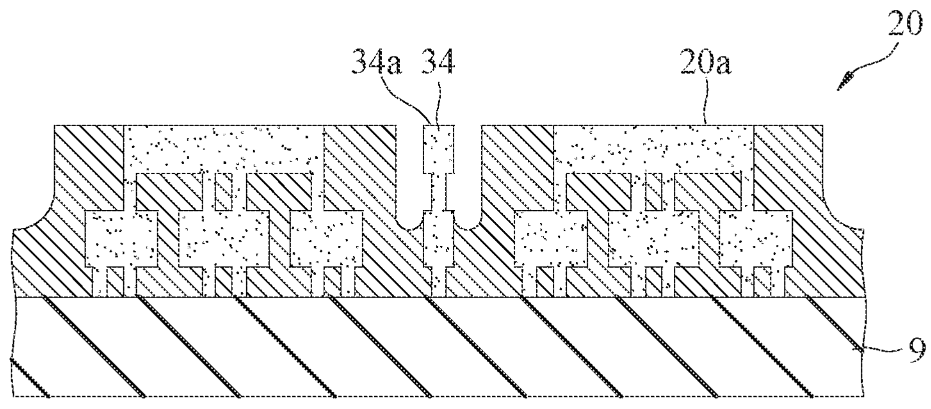
Figures 2, 3E:
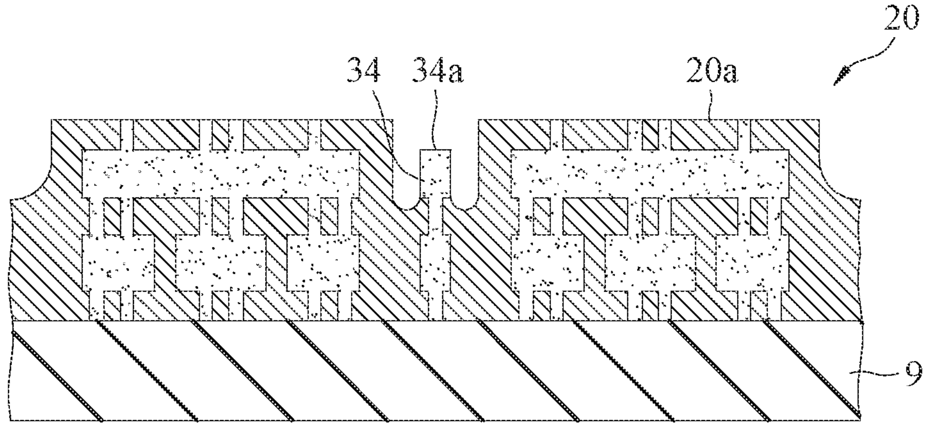

As shown in FIG. 3E-1, the anti-etching barrier layer 23 is removed, so that the first surface 20*a* of each of the carrier board bodies 20 is exposed, and a surface 34*a* of the other end of the supporting bump 34 is flush with the first surface 20*a* of each of the carrier board bodies 20.

On the other hand, following the process shown in FIG. 3D-2, the anti-etching barrier layer 23 is removed to expose the first surface 20*a* of each of the carrier board bodies 20, as shown in FIG. 3E-2, and the surface 34*a* of the other end of the supporting bump 34 is lower than the first surface 20*a* of each of the carrier board bodies 20.

Figures 1, 3F:
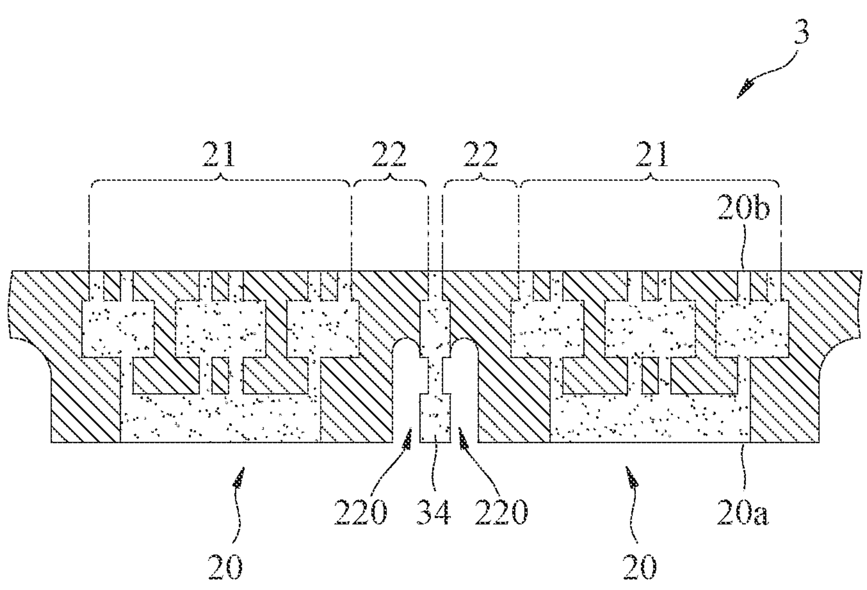
Figures 2, 3F:
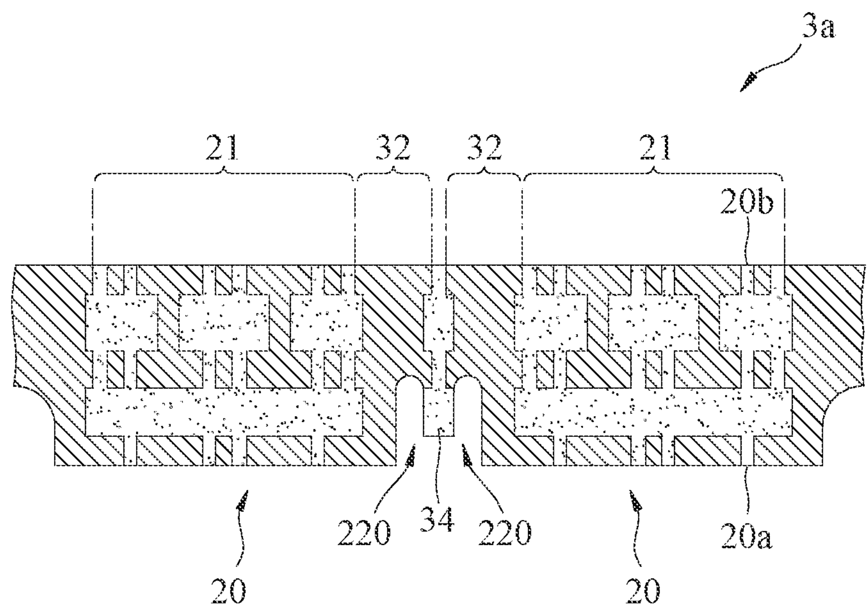

As shown in FIG. 3F-1 or FIG. 3F-2, a surface treatment process is performed to form a surface treatment layer (not shown) on the surfaces of the openings 220. Then, the carrier board 9 is removed to expose the second surfaces 20*b* of the carrier board bodies 20.

In an embodiment, in the subsequent process, the cutting process shown in FIG. 5A to FIG. 5B can be performed to remove the supporting bumps 34, so as to obtain a plurality of one-piece semiconductor packages.

Therefore, the manufacturing method of the present disclosure is to divide the conventional groove into two openings 220 by the design of the supporting bump 34. It not only reduces the space of the conventional groove, but also provides structural strengthening and supporting functions when the carrier board body 20 is assembled onto the package molding carrier 8 for molding operation. Therefore, compared with the prior art, when the molding operation is performed, the carrier board body 20 can withstand the high pressure of the mold sealing glue, and will not be deformed and broken by high pressure, so as to effectively avoid the problem that the adhesive material of the molding layer 27 overflows to the first surface 20*a* (solder pad side) of the carrier board body 20 and contaminates the electrical connection pad 25 of the circuit layer 211.

Moreover, since the adhesive material of the molding layer 27 will not overflow to the first surface 20*a* (solder pad side) of the carrier board body 20, the filleting function of the semi-opening structure 29 will not be affected by the adhesive material of the molding layer 27. Furthermore, the adhesive material of the molding layer 27 will not cover the semi-opening structure 29, so the semi-opening structure 29 will not lose the main function of observing the filleting state of solder.

The present disclosure also provides a semiconductor package carrier board structure 2, 3, 3*a*, comprising: a plurality of carrier board bodies 20 and a plurality of supporting bumps 24, 34.

Each of the carrier board bodies 20 includes a build-up circuit structure 21 and a plurality of conductive blocks 22, 32, and each of the plurality of carrier board bodies 20 is defined with a first surface 20*a* and a second surface 20*b* opposite to each other, and the plurality of conductive blocks 22 are disposed on at least two opposite peripheral surfaces 21*c* of the build-up circuit structure 21 and electrically connected to the build-up circuit structure 21, wherein the first surface 20*a* has a plurality of electrical connection pads 25 (such as electrode pads, solder pads, etc.) to connect external elements (such as chips, solder balls, etc.), and an area A, B formed by the plurality of conductive blocks 22 defines a cutting path S, so that an opening 220 is respectively formed on the first surface 20*a* of each of the plurality of carrier board bodies 20 corresponding to each of the plurality of conductive blocks 22.

The supporting bump 24, 34 is erected between two adjacent ones of the openings 220 and overlaps with the position of the cutting path S (such as a midline position L), and one end of the supporting bump 24, 34 is combined with a bottom 220*b* of each of the openings 220 and protrudes from the bottom 220*b* of each of the openings 220, and a surface 24*a*, 34*a* of the other end of the supporting bump 24, 34 is recessed or flush with the first surface 20*a* of each of the carrier board bodies 20.

In one embodiment, two adjacent ones of the carrier board bodies 20 are connected by the conductive blocks 22 to form a one-piece structure, and the supporting bump 24 is a metal bump.

In one embodiment, two adjacent ones of the carrier board bodies 20 are connected by the plurality of conductive blocks 22, 32 via the supporting bump 34, and the supporting bump 34 is an insulating block. For example, the contour of a surrounding body 34*c* of the supporting bump 34 is formed in a concave-convex shape.

Further, the supporting bump 34 has a lateral portion 340 that is in the shape of a cross, and a part of the lateral portion 340 is embedded in the conductive blocks 22. Alternatively, the supporting bump 34 has at least two lateral portions 340, 341 and is in the shape of "±," and one lateral portion 340 is partially or completely embedded in the conductive blocks 22, 32, and the other lateral portion 341 is used as an end of the supporting bump 34. Even, as shown in FIG. 3D-2, the bottommost surface of the bottom of each of the openings 220 is lower than the lateral portion 341 (which is used as an end of the supporting bump 34), so as to provide additional anti-seepage glue function during the molding operation of the subsequent packaging process.

In one embodiment, a width D of the supporting bump 24, 34 is not greater than a width W of the cutting path S.

In one embodiment, the junction of the bottom 220*b* and a side wall 220*c* of each of the openings 220 is a concave arc surface R.

To sum up, the semiconductor package carrier board structure and the manufacturing method thereof of the present disclosure is to divide the conventional groove into two openings by the design of the supporting bump. It not only reduces the space of the conventional groove, but also provides structural strengthening and supporting functions when the carrier board body is assembled onto the package molding carrier for molding operation. Therefore, when the molding operation is performed, the carrier board body can withstand the high pressure of the mold sealing glue, and will not be deformed and broken by high pressure, so as to effectively avoid the problem that the adhesive material of the molding layer overflows to the first surface of the carrier board body and contaminates the circuit layer.

Moreover, since the adhesive material of the molding layer will not overflow to the first surface of the carrier board body, the adhesive material of the molding layer will not cover the opening. Therefore, the semi-opening structure formed by the opening of the semiconductor package carrier board structure will not lose the main function of filleting and observing the filleting state of solder.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. A semiconductor package carrier board structure, comprising:

a plurality of carrier board bodies each including a build-up circuit structure and a plurality of conductive blocks, wherein each of the plurality of carrier board bodies is defined with a first surface and a second surface opposing the first surface, and the plurality of conductive blocks are disposed on peripheral surfaces of at least two opposite sides of the build-up circuit structure and are electrically connected to the build-up circuit structure, wherein the first surface and/or the second surface has a plurality of electrical connection pads for connecting external elements, and a cutting path is defined by an area formed by the plurality of conductive blocks, so that an opening is respectively formed on the first surface of each of the plurality of carrier board bodies corresponding to each of the plurality of conductive blocks; and a plurality of supporting bumps each erected between two adjacent ones of the openings and overlapping with the cutting path, wherein one end of each of the supporting bumps is combined with a bottom of each of the openings and protrudes from the bottom of each of the openings, and a surface of the other end of each of the supporting bumps is recessed or flush with the first surface of each of the carrier board bodies, and wherein a junction of the bottom and a side wall of each of the openings is a concave arc surface.

2. The semiconductor package carrier board structure of claim 1, wherein two adjacent ones of the carrier board bodies are connected by the conductive blocks to form a one-piece structure, and each of the supporting bumps is a metal bump.

3. The semiconductor package carrier board structure of claim 1, wherein two adjacent ones of the carrier board bodies are connected by the plurality of conductive blocks via the supporting bump, and the supporting bump is an insulating block.

4. The semiconductor package carrier board structure of claim 3, wherein a contour of a surrounding body of the supporting bump is formed in a concave-convex shape.

5. The semiconductor package carrier board structure of claim 4, wherein the supporting bump has a lateral portion that is in a shape of a cross, and a part of the lateral portion is embedded in the conductive blocks.

6. The semiconductor package carrier board structure of claim 4, wherein the supporting bump has at least two lateral portions, wherein one of the lateral portions is partially or completely embedded in the conductive blocks, and the other lateral portion is used as an end of the supporting bump.

7. The semiconductor package carrier board structure of claim 6, wherein a bottommost surface of the bottom of each of the openings is lower than the other lateral portion used as the end of the supporting bump.

8. The semiconductor package carrier board structure of claim 1, wherein a width of each of the supporting bumps is not greater than a width of the cutting path.

* * * * *